Sept. 9, 1952 L. M. MINSK ET AL 2,610,120
PHOTOSENSITIZATION OF POLYMERIC CINNAMIC ACID ESTERS
Filed March 9, 1950
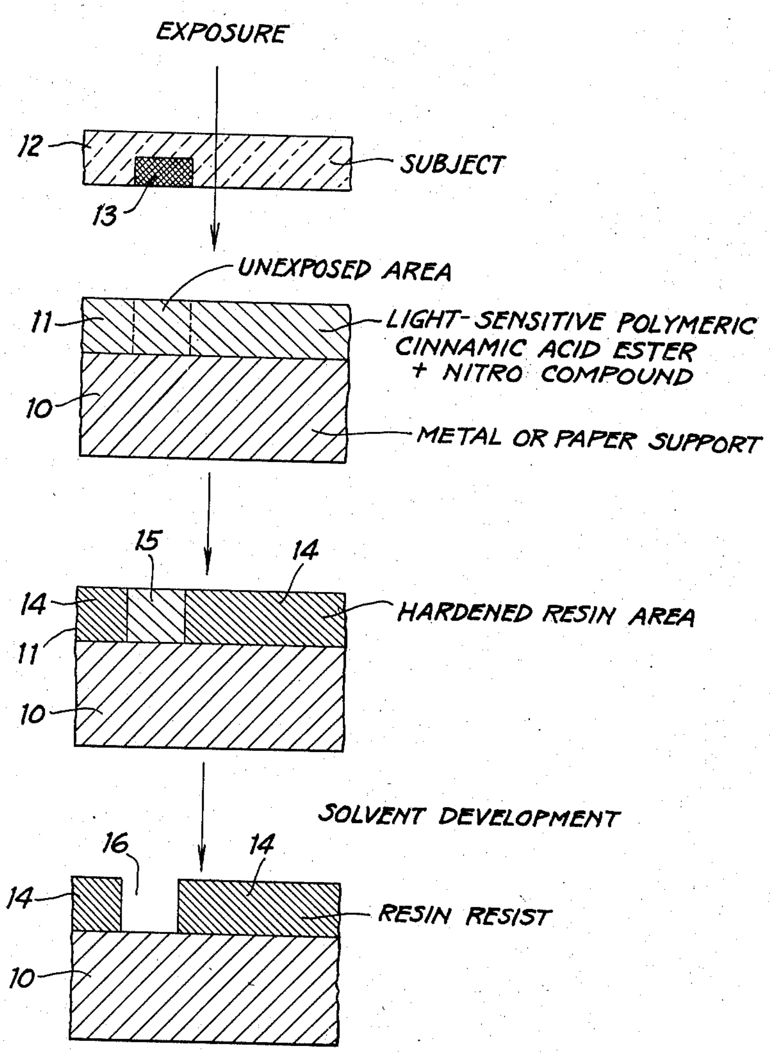
LOUIS M. MINSK
WERTER P. VAN DEUSEN
EARL M. ROBERTSON
INVENTORS
Daniel I. Mayne
BY W. H. McDowell
ATTORNEY & AGENT Patented Sept. 9, 1952

2,610,120

UNITED STATES PATENT OFFICE 2,610,120

PHOTOSENSITIZATION OF POLYMERIC CINNAMIC ACID ESTERS

Louis M. Minsk, Werter P. Van Deusen, and Earl M. Robertson, Rochester, N. Y., assignors to Eastman Kodak Company, Rochester, N. Y., a corporation of New Jersey Application March 9, 1950, Serial No. 148,684

10 Claims. (Cl. 95—7)

This invention relates to the photosensitization of cinnamic acid esters of polymeric materials and more particularly to the photosensitization of cinnamic acid esters of polyvinyl alcohol and cellulose.

It is well known in the art of photomechanical reproduction to utilize various materials such as bichromated shellac, albumin or polyvinyl alcohol for forming resist images upon various supports such as metal plates. The support is then etched or otherwise treated in the areas not covered by the resist image and the resultant plate, usually after removal of the resist image, is used for printing. One method of forming relief images on metal supports is disclosed in the Murray U. S. Patent 1,965,710, granted July 10, 1934, and includes using as a sensitive layer for forming a resist image, a layer of cinnamal ketone containing another resinous material which, after exposure under a design, may be selectively dissolved in the unexposed area whereby the area of the support thus bared may be etched.

We have discovered certain polymeric materials which are light-sensitive and which have properties superior to the mentioned dichromated materials or cinnamal ketone. Furthermore, we have discovered that these polymeric materials can be sensitized to increase their sensitivity to actinic rays as much as a hundred times. Therefore, one object of our invention is to provide the superior light-sensitive materials of particular use in making resists for printing plates. A further object is to provide sensitizer compounds capable of increasing the light-sensitivity of the polymeric materials. Another object is to describe the preferred applications for the sensitized materials. Other objects will become apparent from the following description of our invention.

The objects of our invention are accomplished in part by utilizing a cinnamic acid ester of polyvinyl alcohol or cellulose, preferably the former, as a combined carrier and light-sensitive material, and a nitro compound as a sensitizer for the cinnamic acid ester. Other objects are accomplished by utilizing the sensitive compositions for making resist images for printing plates. Suitable light-sensitive cinnamic acid esters are, for example, cinnamic acid esters of polyvinyl alcohol and cellulose as well as partially alkylated cellulose or polyvinyl alcohol, either completely or partially hydroxy-alkylated cellulose or polyvinyl alcohol, and partially esterified cellulose or polyvinyl alcohol.

The polymeric materials sensitized with the nitro compounds are exposed in the usual manner to line or halftone subjects and after exposure are treated with a solvent to remove the coating only in the unexposed area of the plate and an intermediate plate is thus obtained provided with a resinous resist image useful in a variety of processes to form final printing plates.

In the accompanying drawings, the various figures show in enlarged cross-sectional view the structure of a representative sensitive element of our invention at various stages in the process of producing intermediate printing plates having selected areas covered by a polymeric resist image.

The light-sensitive polymeric materials of the invention are obtained by esterification of hydroxy containing polymeric materials such as cellulose or polyvinyl alcohol with a cinnamic acid halide such as cinnamic acid, o-chloro, or m-nitro cinnamic acid chlorides as follows:

POLYVINYL CINNAMATE

Eleven grams of a polyvinyl alcohol were heated overnight on a steam bath with 100 cc. of pyridine; 100 cc. of pyridine were then added and the suspension cooled to 50° C. 50 grams of a commercial grade of cinnamoyl chloride were then added portionwise with agitation during which time some heat was evolved and a precipitate formed. The reaction mixture was then heated at 50° C. under a condenser provided with a calcium chloride tube, and after four hours, during which time the suspension was occasionally agitated, a viscose dope was obtained. Dilution of the dope with acetone was followed by filtration and precipitation in water. The resultant resin was purified by extensive washing with water until free from chloride and then dried. A yield of 31.5 grams of product was obtained which gave a carbon and hydrogen analysis of 72.3 per cent carbon and 5.7 per cent hydrogen which was equivalent to a resin having 84.6 per cent by weight vinyl cinnamate groups and the remainder being vinyl alcohol groups. In a similar manner, the resin may be esterified to a lesser extent by reducing the amount of acid chloride used and carefully controlling the conditions of esterification. However, it is desirable to esterify the resin to the point at which it becomes soluble in the solvent to be used for selectively developing the resist image, and generally if the polymer is at least 40 mol. per cent esterified, it is satisfactory. The sensitivity of the resin may in effect be varied by variation in molecular weight of the resins since the low molecular weight short chain polymers appear to require more exposure than do the higher polymers to obtain clean resists on development. Esterification of cellulose with the acid chlorides is carried out to the extent indicated in a comparable manner by treating the cellulose fiber or partially esterified cellulose esters with the desired acid chloride under conditions similar to the above.

A typical resist lacquer useful for forming resist images on printing plates is compounded of the following materials:

| | | |
|---|---|---|
| Polyvinyl cinnamate | grams | 2.5 |
| Chlorobenzene | cc. | 25 |
| Toluene | cc. | 75 |
| Nitro compound | gram | 0.25 |

When using a m-nitrocinnamate such as polyvinyl m-nitrocinnamate, we prefer to disperse the resin together with the sensitizer in nitrobenzene. The coatings made from this solution are preferably developed with nitrobenzene at a temperature of about 110° F. for about one minute. When using the cellulose cinnamate it is preferable to disperse the ester in 1,4-dioxane for coating, and develop the resist image in 1,4-dioxane.

The solvent for the coating composition as well as for the developer will vary somewhat depending upon the particular cinnamic acid ester in use as indicated above. For polyvinyl cinnamate of composition indicated above, a variety of solvents can be used; for example, aromatic alcohols, ethers, ether-alcohols, esters, aldehydes, ketones, halogenated hydrocarbons, nitro hydrocarbons, and amines; heterocyclic alcohols, ethers, aldehydes, nitrogen ring compounds; and aliphatic ketones, particularly methyl ethyl ketone, as well as unsaturated ketones, diketones, ether-alcohol-esters, dibasic acid esters, chlorohydrins, N-alkyl-substituted amides, nitroparaffins, and glacial acetic acid. Furfural, benzaldehyde, morpholine and acetophenone, in the order given, are most satisfactory from the standpoint of toxicity and fire hazard. Furfural, cyclohexanone and methyl glycol acetate are preferred when considering cost and evaporation rate. An excellent solvent combination, particularly for tank development in preparing resist images on copper and paper printing plates, is a mixture of methyl glycol acetate and xylene containing up to about four volumes of the latter. With the further addition of about one part of an alcohol, especially isopropyl alcohol, the printing plate, after exposure and development, can be washed in running water without causing the coating to blush. Furfural can be used in a similar manner. Addition of secondary solvents to coating compositions, in addition to the use of the primary solvent required to dissolve the resin, e. g. about 10 per cent methyl alcohol, has the advantage of increasing the solubility of certain of the nitro compound sensitizers in the major solvent such as chlorobenzene.

The concentration of sensitizer compound in the coating formula depends somewhat upon the solubility in the particular solvent used, the compatibility of the sensitizer with the sensitive polymeric material and of course the amount of polymeric material present. In the case of polyvinyl cinnamate, from about 2 to 25 per cent, preferably 10 per cent, by weight of nitro compound based on the weight of polyvinyl cinnamate gives useful results. With certain sensitizers, e. g., 2,4,6-trinitroaniline, an amount less than 2 per cent produces measurable speed increases. The concentration of polyvinyl cinnamate in the coating formula can be varied as required by the particular conditions of coating under consideration, about 2.5% resin being useful for grained metal or paper plates and about 7.5% for polished metal such as copper, zinc and magnesium.

Examples of nitro compounds which are suitable as sensitizers for the polymeric cinnamic acid esters, especially polyvinyl cinnamate, are tabulated in the following table, the numerical value opposite each compound indicating the relative speed obtained when using polyvinyl cinnamate as the sensitive polymeric material. The coatings from which the speed evaluations were obtained were made from solutions of one part of chlorobenzene and three parts of toluene by volume containing 2.5 grams of polyvinyl cinnamate and 0.25 gram of the nitro compound. A speed value of 2 represents the initial speed of the polyvinyl cinnamate. For comparison purposes on the same scale, a dichromate sensitized shellac coating would have a speed value of approximately 30.

| | |
|---|---|
| α-Nitronaphthalene | 200 |
| β-Nitrostyrene | 30 |
| Nitrobenzene | 8 |
| p-Nitrodiphenyl | 200 |
| p-Nitroaniline | 100 |
| m-Nitroaniline | 50 |
| m-Nitrophenol | 70 |
| p-Nitrophenol | 70 |
| p-Nitroanisole | 60 |
| m-Nitroanisole | 50 |
| o-Nitroanisole | 20 |
| p-Nitrodimethylaniline | 60 |
| p-Dinitrobenzene | 40 |
| p-Nitrodiphenylether | 30 |
| o-Nitrodiphenylether | 10 |
| m-Nitrobenzalacetophenone | 30 |
| p-Nitrobromobenzene | 20 |
| m-Nitrobenzaldehyde | 10 |
| p-Nitrobenzaldehyde | 10 |
| p-Nitrochlorobenzene | 10 |
| m-Chlorophenol | 6 |
| 5-nitro-1-naphthylamine | 4 |
| 2,4,6-trinitroaniline | 300 |
| 2,6-dichloro-4-nitroaniline | 300 |
| 4-nitro-2-chloroaniline | 300 |
| 5-nitro-2-aminotoluene | 200 |
| 2,4-dinitroaniline | 90 |
| 2,4-dinitro-6-chloroaniline | 90 |
| 2,6-dichloro-4-nitrophenol | 70 |
| 2,6-dinitroaniline | 70 |
| 5-nitro-2-aminoanisole | 60 |
| 2,6-dinitro-4-chloroaniline | 60 |
| 4-chloro-3-trifluoromethylnitrobenzene | 30 |
| 2,4,6-trinitrophenol | 20 |
| m-Nitro-β-nitrostyrene | 40 |
| Sym-trinitrobenzene | 20 |
| 3,5-dinitrobenzalacetophenone | 20 |
| 2,4,6-trinitroanisole | 10 |
| 2,4,6-trinitrobenzaldehyde | 10 |
| 2,4,6 - trinitro - 1,3 - dimethyl-5-t-butylbenzene | 10 |
| 4-nitro-1,2-diaminobenzene | 10 |
| 2,4-dinitrobenzaldehyde | 10 |
| 2,6-dichlorobenzalehyde | 10 |
| 2,4-dinitrophenol | 8 |
| Dipicrylamine | 6 |
| m-Nitroacetophenone | 10 |

The above compounds are classifiable as nitro aryl compounds having a nucleus containing from 6 to 10 carbon atoms, i. e. benzene and naphthalene nuclei, 1 to 3 nitro groups being attached to the nucleus, with the limitation that the mononitro compounds are free of amino, hydroxyl and formyl groups in a position ortho to the nitro group, all of the nitro aryl compounds being free of an amino and a hydroxyl group in positions ortho to each other and free of carboxyl and sulfonic acid groups. Nitro aryl compounds not possessing these structural limitations appear to have little if any sensitizing effect upon the polyvinyl cinnamate resin, for example, o-nitroaniline, 2-amino-4,6-dinitriphenol, o-nitrobenzaldehyde and o-nitrophenol. Nitro aryl compounds containing carboxylic or sulfonic acid groups are either relatively poor sensitizers or are not usable in the coating and developing solvent systems because of limited solubility in organic solvents. Sensitizers comprising the preferred embodiment of our invention are included in the above list and for the most part are nitro compounds having the general formula:

$$R—NO_2$$

wherein R represents a mononuclear aryl radical containing at least one of the substituents nitro, amino, hydroxyl, phenyl, chloro, bromo, alkyl, alkoxy, phenoxy, dialkylamino, formyl, trifluoromethyl and fused-on phenyl, the mononitro compounds being free of amino, hydroxy and formyl groups in a position ortho to the nitro group and the nitro compounds being free of an amino and a hydroxyl group in positions ortho to each other and free of carboxyl and sulfo groups, and the mentioned aryl radical containing not more than three of any one of the mentioned substituents.

As will be apparent from the speed values of the nitro compounds tabulated above, the mono nitro aniline compounds free of amino, hydroxyl and formyl groups ortho to the nitro group and free of amino and hydroxyl groups ortho to each other and carboxyl and sulfo groups are important. Similarly, the dinitroaniline sensitizers free of amino and hydroxyl groups ortho to each other and carboxyl and sulfo groups represent a valuable group of sensitizers. Of especial value are the 2-chloro-4-nitroaniline compounds containing no other substituent except chlorine on the aryl nucleus containing the nitro group.

Our invention will be understood by consideration of the accompanying drawings and the following examples illustrating various means of employing the light-sensitive polymeric materials for forming resist images and printing plates therefrom.

*Example*

A cinnamic acid ester such as polyvinyl cinnamate (2.5 grams), the preparation of which is described above, was dissolved in a mixture of 25 cc. of chlorobenzene and 75 cc. of toluene and 0.25 gram of 2,4,6-trinitroaniline was then dissolved in the resinous dope. The order of mixing the components is not especially critical. The dope was then poured onto a lithographic paper printing plate support such as a paper sheet carrying a layer of material which is repellent to greasy printing inks when wet and the coated plate was whirled at approximately 50 to 180 R. P. M. until the coating was dry. The operation is preferably carried out in subdued light. The sensitized plate appears as shown in enlarged cross-sectional view in the first stage of the drawings wherein layer 10 represents the paper support and layer 11 the polyvinyl cinnamate sensitized with the nitro compound. The plate was then exposed under a line or halftone image at 4 feet from a 35-ampere white flame carbon arc for about 1 minute, as shown in the first stage of the drawings wherein the subject is represented by a transparent layer 12 containing an image 13 opaque to light. The result of exposure is to insolubilize the layer in the exposed region 14 of layer 11 leaving unaffected material in the exposed area 15 as shown in the drawings. After exposure, development was carried out for two minutes in a tray of methyl ethyl ketone. The result was that the unexposed area 15 of the plate was readily dissolved leaving a resin resist 14 on the support 10 and in the unexposed areas 16 from which the resin and sensitizer had been removed, the ink-repellent area of the support was revealed. If desired, the resist can now be dyed, with a suitable dye to increase its visibility, dye being selected which does not stain the non-printing areas 16. At this stage the plate can be used as a lithographic printing plate or further processed depending upon the particular support which has been used or the photomechanical process under consideration. Thus, when applying the above procedure to making etched zinc halftone images, the above type of coating was coated on a degreased photo-engraving zinc plate, dried, exposed, developed and etched for four minutes with 10 per cent nitric acid solution, to which a wetting agent may be added, to obtain a relief plate. The plate was then rubbed to remove the resist, the removal being aided, if desired, by use of a solvent such as benzene or acetone.

When adapting the sensitive materials of the invention to producing bimetallic lithographic plates containing chromium line or halftone images the resist is formed on a degreased copper plate following which the plate is chrome plated under the usual conditions. During the preparation of such a plate the operations of baking and swabbing the plate customarily employed when certain bichromated resists are in use can be dispensed with. If desired, the resist can be formed on a chromium plated copper plate followed by etching out the chromium.

When producing etched copper halftone images, the resist is formed on a degreased copper plate in the manner of the example and then the plate is etched with ferric chloride solution. During this operation it is not necessary to employ the usual "burning in" of the resist customarily employed with other materials nor is it necessary to scrub the plate during the etching operation to observe side action. Also, the resist can be removed from the etched plate using solvent and scrubbing which is relatively simple compared to the use of hot concentrated alkali solution usually employed for removing resist images. The procedure can also be applied to making etched zinc or magnesium halftone plates in processes formerly using dichromated shellac. However, the usual temperature and humidity controls are not necessary.

The light-sensitive polymeric compositions of the invention are also useful in forming printing plates having a cellulose ester support. The sensitive composition is coated on a sheet of, for example, cellulose triacetate film base and after forming the resist image thereon in the manner of the example, with the exception that benzene should be used for development, the areas of the cellulose ester support bared in the development step are hydrolyzed with a solution of sodium hydroxide in aqueous alcohol, the result of which is a printing plate which when moistened with water repels the usual greasy printing inks in the hydrolyzed region while the ink adheres to the relief resist image and the plate is suitable for use on a lithographic press. However, prior to printing, it is preferred to remove the resist.

When preparing an ink-carrying resist image on grained zinc or aluminum lithographic plates, the sensitive materials of the invention such as the compositions above mentioned are coated on grained zinc or aluminum plates. Following somewhat the conventional technique of treating plates coated with albumin, the plate is etched in five per cent acetic acid, then may be gum etched in a standard solution, dried, and coated with the resist lacquer. After exposure and development, the plate is gum etched and then is ready for the press. The conventional steps of swabbing the plate during development or use of a developing ink are not necessary and use of the resist of the invention provides the photolithographer with a much simplified process for producing plates having high press endurance.

Zincated lithographic printing plates can be prepared by forming the resist on a zincated aluminum plate by means of exposure and development as in the example with the result that the area of the plate bared during the developing step is repellent to ink and the resist image formed carries the ink in the printing operation. In making zincated plates the aluminum plate can be first chromatized, then after coating the sensitive layer of the invention followed by exposure and development, the plate can be zincated. In a similar manner, resist images may be formed on dyed anodized aluminum plates without zincating which may be etched in the conventional manner, or if desired, the resist may be formed on a glass plate and etching carried out by means of hydrofluoric acid.

The sensitive compositions of the invention can be used in a process of making ungrained copper printing plates which may be used for preproving a copper-chromium bimetallic plate. The process includes forming the resist image on a copper plate, then treating the plate with a cyanide-silver nitrate solution to deposit silver in the bare areas of the copper plate which then become ink-repellent, the resist being ink-receptive. A number of prints can be made from the plate at this stage. If a bimetallic plate is to be made later, the silver can be removed and those areas chromium plated. For removing the silver overlying the copper in the regions not occupied by the resist, a solution of a copper salt and an alkali metal halide may be used. As a result of the removal of the silver, contamination of the chromium plating bath used subsequently to form the copper-chromium bimetallic plate is prevented.

In a similar manner, any of the mentioned sensitizers can be incorporated into a solvent system containing a cinnamic acid ester especially polyvinyl cinnamate and the resultant composition used for making a printing plate.

It will be apparent from the above description that the preferred process of our invention broadly contemplated includes the steps of exposing a layer of a cinnamic acid ester of polyvinyl alcohol containing as a sensitizer a nitro-compound activating the ester in the presence of actinic rays to render the ester insoluble and then dissolving only the unexposed area of the layer with an organic solvent leaving the ester on the support in relief form in only the exposed area.

The preferred light-sensitive coatings of our invention broadly contemplated include light-sensitive coatings comprising a cinnamic acid ester of polyvinyl alcohol and as a sensitizer a nitro compound activating the ester in the presence of actinic rays to render it insoluble in an organic solvent.

The mechanism of the activation is not fully understood. However, it does enable the insolubility to be obtained with shorter exposures to light.

As indicated above, the type of printing plate obtained depends somewhat upon the support used. Resists on grained metal and zincated supports have been described, these supports having their surfaces thus prepared, when moistened with water, are repellent to the usual greasy printing inks. Cellulose ester supports subsequently surface hydrolyzed have been mentioned and other ink-repellent surfaces which may be provided with resist images according to our invention include plates or fibrous supports having a hydrophilic surface, for example, of water permeable cellulose ether, polyvinyl alcohol, partially hydrolyzed polyvinyl esters, gum Arabic, acrylic acid polymers and co-polymers, casein, and the like. The mentioned techniques for making aluminum plates can be employed for making an aluminum plate having aluminum foil as the metal support. In this instance, since handling of thin foil is difficult, it is preferable to reinforce it, for example, by lamination with a paper backing, the surface away from the metal foil preferably carrying a water resistant coating such as wax, cellulose ester or synthetic resin applied subsequent or prior to lamination.

We have found that when employing the light-sensitive materials of the invention for making printing plates, polyvinyl cinnamate is the most suitable of the polymeric materials since development of exposed layers of this resin give cleaner differentiation between the exposed and unexposed regions of a plate and it has superior adhesion to supports. Under certain conditions, cellulose cinnamate may be desired but polyvinyl cinnamate is more generally useful. In all cases, the synthetic polymeric materials give cleaner resist images under much less critical conditions of development than have been obtainable by use of bichromated materials or previously described sensitive materials containing the cinnamal group, that is, there is no tendency for the cinnamate resist image to be dissolved away during development. A further advantage of our sensitive materials lies in the fact that coatings of the polymeric esters may be made considerably in advance of the time of actual usage and after storage are found to have been little affected by non-ideal conditions of temperature and humidity. Bichromated glue or albumin layers can be sensitized only slightly in advance of usage because of their poor keeping properties. Other advantages of our sensitive materials have been noted in the above examples. Accordingly, the present invention offers to the photoengraver and photolithographer a presensitized product having a wide diversity of usage, A further advantage residing in our sensitive materials is the fact that no auxiliary resinous materials are required in addition to the cinnamic acid ester. That is, in the case of the prior art ketones referred to, it is necessary to use an auxiliary resin carrier for the sensitive ketone, whereas, according to our invention, the polymeric cinnamic acid ester functions both as the carrier and light-sensitive material and accordingly is more efficacious and produces superior results.

What we claim is:

1. A photomechanical resist composition comprising a cinnamic acid ester of polyvinyl alcohol as a combined carrier and light-sensitive material, and as a sensitizer for the composition a nitro aryl compound having a nucleus containing from 6 to 10 carbon atoms, from 1 to 3 nitro groups being attached to said nucleus, the mono-nitro compounds being free of amino, hydroxyl and formyl groups in a position ortho to the nitro group, said nitro aryl compounds being free of an amino and a hydroxyl group in positions ortho to each other, and free of carboxyl and sulfo groups.

2. A photomechanical resist composition comprising a cinnamic acid ester of polyvinyl alcohol as a combined carrier and light-sensitive material, and as a sensitizer for the composition a nitro compound selected from those having the general formula $$R—NO_2$$

wherein R represents a mononuclear aryl radical containing at least one substituent selected from the group consisting of nitro, amino, hydroxyl, phenyl, chloro, bromo, alkyl, alkoxy, phenoxy, dialkyl amino, formyl, trifluoromethyl and fused-on phenyl, the mononitro compounds being free of amino, hydroxyl and formyl groups in a position ortho to the nitro group, said nitro compounds being free of an amino and a hydroxyl group in positions ortho to each other and free of carboxyl and sulfo groups, said aryl radical containing not more than three of any one of said substituents.

3. A photomechanical resist composition comprising polyvinyl cinnamate as a combined carrier and light-sensitive material, and as a sensitizer for the composition a mononitroaniline compound free of amino, hydroxyl and formyl groups ortho to the nitro group of said compound, amino and hydroxyl groups ortho to each other, and carboxyl and sulfo groups.

4. A photomechanical resist composition comprising polyvinyl cinnamate as a combined carrier and light-sensitive material, and as a sensitizer for the composition a dinitroaniline compound free of amino and hydroxyl groups ortho to each other and carboxyl and sulfo groups.

5. A photomechanical resist composition comprising polyvinyl cinnamate as a combined carrier and light-sensitive material, and as a sensitizer for the composition a 2-chloro-4-nitroaniline containing no other group than chlorine.

6. A photomechanical resist composition comprising polyvinyl cinnamate as a combined carrier and light-sensitive material, and as a sensitizer for the composition 5-nitro-2-aminotoluene.

7. A photomechanical resist composition comprising polyvinyl cinnamate as a combined carrier and light-sensitive material, and as a sensitizer for the composition p-nitro diphenyl.

8. A photomechanical resist composition comprising polyvinyl cinnamate as a combined carrier and light-sensitive material, and as a sensitizer for the composition α-nitro naphthalene.

9. A photomechanical resist composition comprising polyvinyl cinnamate as a combined carrier and light-sensitive material, and as a sensitizer for the composition 2,4,6-trinitroaniline.

10. A photomechanical resist composition comprising polyvinyl cinnamate as a combined carrier and light-sensitive material, and as a sensitizer for the composition 2-chloro-4-nitroaniline.

LOUIS M. MINSK.
WERTER P. VAN DEUSEN.
EARL M. ROBERTSON.

REFERENCES CITED

The following references are of record in the file of this patent:

UNITED STATES PATENTS

| Number | Name | Date |
|---|---|---|
| 1,965,710 | Murray | July 10, 1934 |
| 2,318,959 | Muskat | May 11, 1943 |
| 2,420,720 | Pechukas | May 20, 1947 |